(12) United States Patent
Silver et al.

(10) Patent No.: US 8,701,065 B1
(45) Date of Patent: Apr. 15, 2014

(54) MICROWAVE ACOUSTIC WAVE FILTERS (71) Applicant: Resonant LLC, Santa Barbara, CA (US)

(72) Inventors: Richard N. Silver, San Francisco, CA (US); Kurt F. Raihn, Goleta, CA (US); Neal O. Fenzi, Santa Barbara, CA (US); Robert B. Hammond, Santa Barbara, CA (US)

(73) Assignee: Resonant LLC, Santa Barbara, CA (US)

( * ) Notice: Subject to any disclaimer, the term of this patent is extended or adjusted under 35 U.S.C. 154(b) by 0 days.

(21) Appl. No.: 13/939,065

(22) Filed: Jul. 10, 2013

Related U.S. Application Data (63) Continuation of application No. 13/934,051, filed on Jul. 2, 2013.

(60) Provisional application No. 61/798,482, filed on Mar. 15, 2013.

(51) Int. Cl.
*G06F 17/50* (2006.01)
*G06F 9/455* (2006.01)
*H01L 41/00* (2013.01)
*H03H 7/01* (2006.01)

(52) U.S. Cl.
USPC ........... 716/110; 716/109; 716/125; 716/127; 716/132; 716/133; 333/133; 333/175; 333/167; 333/186

(58) Field of Classification Search
USPC ................. 716/109, 110, 125, 127, 132, 133; 333/133, 175, 167, 186
See application file for complete search history.

(56) References Cited

U.S. PATENT DOCUMENTS

| 1,795,204 | A | | 3/1931 | Espenschied |
| 5,600,287 | A | * | 2/1997 | Kwan et al. .................... 333/195 |
| 6,862,441 | B2 | * | 3/2005 | Ella ............................. 455/307 |
| 7,312,674 | B2 | * | 12/2007 | Duwel et al. .................. 333/186 |
| 7,586,389 | B2 | * | 9/2009 | Ali-Ahmad et al. ........... 333/133 |
| 7,639,101 | B2 | | 12/2009 | Tsuzuki et al. |
| 7,646,265 | B2 | * | 1/2010 | Stuebing et al. .............. 333/189 |
| 7,682,777 | B2 | * | 3/2010 | Franosch et al. .............. 430/311 |
| 7,719,382 | B2 | | 5/2010 | Tsuzuki et al. |

(Continued)

OTHER PUBLICATIONS

Fabre et al.; "Low power current-mode second-order bandpass IF filter"; Publication Year: 1997; Circuits and Systems II: Analog and Digital Signal Processing, IEEE Transactions on; vol. 44 , Issue: 6; pp. 436-446.*

(Continued)

*Primary Examiner* — Helen Rossoshek
(74) *Attorney, Agent, or Firm* — Vista IP Law Group LLP (57) ABSTRACT A method of designing an acoustic microwave filter comprises selecting a filter section based on frequency response requirements. The filter section includes an input, an output, and a plurality of circuit elements. The circuit elements have at least in-line acoustic resonators or in-shunt acoustic resonators. The method further comprises selecting a value for each circuit element, selecting a number of filter sections, and cascading the selected number of filter sections to create a cascaded filter circuit design, such that at least one pair of immediately adjacent filter sections are connected to each other via their inputs or their outputs. The method further comprises adding parasitic effects to the cascaded filter circuit design to create a pre-optimized filter circuit design, optimizing the pre-optimized filter circuit design to create a final filter circuit design, and constructing the acoustic microwave filter based on the final filter circuit design.

20 Claims, 9 Drawing Sheets

(56) References Cited

U.S. PATENT DOCUMENTS

| | | | |
|---|---|---|---|
| 7,771,987 B2* | 8/2010 | Edmonson et al. | 435/287.2 |
| 7,777,597 B2* | 8/2010 | Beaudin et al. | 333/189 |
| 7,791,432 B2* | 9/2010 | Piazza et al. | 333/186 |
| 7,855,564 B2* | 12/2010 | Sabah et al. | 324/600 |
| 7,863,071 B1* | 1/2011 | Ivanov et al. | 438/53 |
| 7,863,999 B2 | 1/2011 | Tsuzuki et al. | |
| 7,924,114 B2* | 4/2011 | Tsuzuki et al. | 333/99 S |
| 8,018,303 B2* | 9/2011 | Handtmann et al. | 333/189 |
| 8,026,776 B2 | 9/2011 | Ueda et al. | |
| 8,063,714 B2 | 11/2011 | Tsuzuki et al. | |
| 8,063,717 B2 | 11/2011 | Bradley et al. | |
| 8,204,031 B2* | 6/2012 | Jian et al. | 370/339 |
| 8,319,584 B2* | 11/2012 | Piazza et al. | 333/186 |
| 8,487,715 B2* | 7/2013 | Mohanty et al. | 333/133 |
| 8,497,747 B1* | 7/2013 | Wojciechowski et al. | 333/186 |
| 8,512,800 B2* | 8/2013 | Godshalk et al. | 427/100 |
| 8,521,090 B2* | 8/2013 | Kim et al. | 455/63.1 |
| 2009/0002102 A1* | 1/2009 | Tsuzuki et al. | 333/204 |
| 2009/0273408 A1* | 11/2009 | Inoue et al. | 333/4 |
| 2010/0134207 A1* | 6/2010 | Mohanty et al. | 333/186 |
| 2011/0012696 A1* | 1/2011 | Skarp | 333/195 |
| 2011/0171922 A1* | 7/2011 | Kim et al. | 455/307 |
| 2011/0193656 A1* | 8/2011 | Erb et al. | 333/189 |
| 2012/0302188 A1* | 11/2012 | Sahota et al. | 455/150.1 |
| 2013/0119491 A1* | 5/2013 | Luce et al. | 257/416 |
| 2013/0122627 A1* | 5/2013 | Harame et al. | 438/50 |
| 2013/0169383 A1* | 7/2013 | Adkisson et al. | 333/186 |
| 2013/0170405 A1* | 7/2013 | Yan et al. | 370/277 |

OTHER PUBLICATIONS

Park et al.; "Comparison of micromachined FBAR band pass filters with different structural geometry"; Publication Year: 2003; Microwave Symposium Digest, 2003 IEEE MTT-S International; vol. 3; p. 2005-2.*

Campbell, George A., Physical Theory of the Electric Wave-Filter, The Bell System Technical Journal, vol. I, No. 2 (Nov. 1992).

Ikata, O. et al., Development of Low-Loss Band-Pass Filters Using Saw Resonators for Portable Telephones, 1992 Ultrasonic Symposium, pp. 111-115.

Matthaei, George L. et al., Microwave Filters, Impedance-Matching Networks, and Coupling Structures, McGraw-Hill Book Company, pp. 95-97, 438-440 (1964).

Morgan, David, Suface Acoustic Wave Filters with Applications to Electronic Communications and Signal Processing, pp. 335-339, 352-354 (2007).

Van Dyke, K.S., The Piezo-Electric Resonator and its Equivalent Network Proc. IRE, vol. 16, 1928, pp. 742-764.

Zhou, Jiafeng, Microwave Filters, 2010, (27pages).

Zobel, Otto J., Theory and Design of Uniform and Composite Electric Wave-Filters, The Bell System Technical Journal, vol. II, No. 1 (Jan. 1923).

File History of U.S. Appl. No. 61/802,114, entitled "Element Removal Design in Microwave Filters," filed Mar. 15, 2013.

File History of U.S. Appl. No. 13/838,943, entitled "Network Synthesis Design of Microwave Acoustic Wave Filters," filed Mar. 15, 2013.

Ken-ya Hashimoto, Surface Acoustic Wave Devices in Telecommunications, Springer, 2000, chapter 5.4—"Impedance Element Filters" especially figures 5.41 and 5.42.

W.P. Mason, Electrical Wave Filters Employing Quartz Crystals as Elements, The Bell System Technical Journal (1934).

* cited by examiner

| Element | Cap (pF) | Element | C0 (pF) | Fres (MHz) |
|---|---|---|---|---|
| C1 | 5.8 | Res1 | 0.84 | 1828.30 |
| C2 | 5.8 | Res2 | 0.24 | 1983.60 |
| C3 | 11.59 | Res3 | 1.84 | 1853.40 |
| | | Res4 | 1.67 | 1828.30 |
| | | Res5 | 0.48 | 1983.60 |
| | | Res6 | 1.84 | 1853.40 |
| | | Res7 | 1.67 | 1828.30 |
| | | Res8 | 0.48 | 1983.60 |
| | | Res9 | 3.68 | 1853.40 |

| Element | Cap (pF) | | Element | C0 (pF) | Fres (MHz) |
|---|---|---|---|---|---|
| C1 | 2.72 | | Res1 | 1.02 | 1818.80 |
| | | | Res2 | 1.06 | 1879.41 |
| | | | Res3 | 1.00 | 1829.91 |
| | | | Res4 | 0.52 | 1987.94 |
| | | | Res5 | 2.00 | 1857.83 |
| | | | Res6 | 3.09 | 1804.06 |
| | | | Res7 | 5.62 | 1852.84 |

MICROWAVE ACOUSTIC WAVE FILTERS

RELATED APPLICATION DATA

The present application is a continuation of U.S. patent application Ser. No. 13/934,051, filed Jul. 5, 2013, which claims the benefit under 35 U.S.C. §119 to U.S. provisional patent application Ser. No. 61/798,482, filed Mar. 15, 2013. The foregoing application is hereby incorporated by reference into the present application in its entirety.

FIELD OF THE INVENTION

The present inventions generally relate to microwave filters, and more particularly, to acoustic wave microwave filters.

BACKGROUND OF THE INVENTION

Frequency selective electrical signal filters for communications applications were developed beginning around 1910, for telegraphy and telephony uses, particularly for multiplexing and de-multiplexing of communication signal channels carried on long distance cables and wireless links. Filter design methods, named "image" or "image parameter" design methods were developed by Bell Laboratories, among others, in the 1920s (see George A. Campbell, Physical Theory of the Electric Wave Filter, The Bell System Technical Journal, Volume I, No. 2 (November 1922); Otto J. Zobel, Theory and Design of Uniform and Composite Electric Wave-Filters, The Bell System Technical Journal, Volume II, No. 1 (January 1923)). Using these techniques, the filter is designed as a transmission line that is topologically broken up into often identical sections that have the same or similar input impedance, and the same or similar output impedance. The sections are connected in alternating fashion so that the inputs of adjacent sections connect to each other, and the outputs of adjacent sections connect to each other (i.e., the input of the first section is connected to the input of the second section, the output of the second section is connected to the output of the third section, the input of the third section is connected to the input of the fourth section, etc.). Since the input impedances or output impedances always face each other, there will be no reflection at the interfaces between the sections as a signal is transmitted through the filter.

Generally, the image design method produces an "initial filter design". More design steps are needed to produce a "final filter design" that can be manufactured. These additional steps may include: combining like adjacent elements, adding or deleting specific circuit elements to produce a desired enhancement to the filter characteristic, adding parasitic effects not included in the idealized circuit element models to more accurately represent the physical circuit to be manufactured, performing a computer optimization of the circuit element values to better match the desired requirement, etc.

Acoustic wave (AW) resonators, specifically quartz bulk acoustic wave (BAW) resonators, began to be used in some electrical signal filters. The equivalent circuit of an AW resonator has two resonances closely spaced in frequency call the "resonance" frequency and the "anti-resonance" frequency (see K. S. Van Dyke, Piezo-Electric Resonator and its Equivalent Network Proc. IRE, Vol. 16, 1928, pp. 742-764). The image filter design methods were applied to filter circuits utilizing these quartz resonators, and two AW filter circuit types resulted: "ladder" and "lattice" AW filter designs (see U.S. Pat. No. 1,795,204; W. P. Mason, Electrical Wave Filters Employing Quartz Crystals as Elements, The Bell System Technical Journal (1934)). In subsequent decades, the quartz ladder design was typically only used for single channel filters due to its extremely narrow bandwidth. The majority of quartz filters were hybrid-lattice designs, which allow less narrow bandwidths, but normally require inductors.

Network synthesis designs began to appear in the 1960s, which permitted a much wider variety of filter circuit designs, but also normally required inductors, which tend to be physically large and lossy compared to capacitors. These designs were at RF frequencies and lower (<100 MHz) and were made using bulk crystals, often quartz. Surface acoustic wave (SAW) filters also began to appear at this time. These designs suffered from high insertion losses due to transducer losses, allowing uses only at intermediate frequencies—not radio frequencies, and were based on transversal designs, also termed "tapped delay lines."

Beginning in about 1992, thin film SAW resonators and BAW resonators were developed and began to be used in microwave (frequencies >500 MHz). AW impedance element filter (IEF) designs, which can also be referred to as Espenschied-type ladder acoustic wave filter designs (see O. Ikata, et al., Development of Low-Loss Bandpass Filters Using Saw Resonators for Portable Telephones, 1992 Ultrasonics Symposium, pp. 111-115). Image designed AW IEF bandpass filters in SAW and BAW implementations are often used for microwave filtering applications in the radio frequency (RF) front end of mobile communications devices. Of most particular importance in the mobile communication industry is the frequency range from approximately 500-3,500 MHz. In the United States, there are a number of standard bands used for cellular communications. These include Band 2 (~1800-1900 MHz), Band 4 (~1700-2100 MHz), Band 5 (~800-900 MHz), Band 13 (~700-800 MHz), and Band 17 (~700-800 MHz); with other bands emerging.

The duplexer, a specialized kind of filter is a key component in the front end of mobile devices. Modern mobile communications devices transmit and receive at the same time (using LTE, WCDMA or CDMA) and use the same antenna. The duplexer separates the transmit signal, which can be up to 0.5 Watt power, from the receive signal, which can be as low as a pico-Watt. The transmit and receive signals are modulated on carriers at different frequencies allowing the duplexer to select them, even so the duplexer must provide the frequency selection, isolation and low insertion loss in a very small size often only about two millimeters square. The image designed bandpass AW IEF filter is universally preferred to be used in a duplexer, because it satisfies these requirements, and significantly better than alternatives like the tapped delay line (since it has higher loss), and the resonant single-phase unidirectional tranducer (SPUDT) filter (since the narrow lines required prevent scaling to microwave frequencies); although the double-mode SAW (DMS) (also called longitudinally coupled resonator (LCR)) filter is sometimes used for the receive filter in a duplexer due to the balanced output it provides. (See David Morgan, Surface Acoustic Wave Filters With Applications to Electronic Communications and Signal Processing Morgan, pp. 335-339, 352-354 (2007)). Traditionally, the IEF filters utilize a simple paired resonator architecture consisting of only one in-line resonator and only one in-shunt resonator for each image section.

Minor variations to these traditional AW IEF filter designs have also been considered for these applications (see U.S. Pat. No. 8,026,776 and U.S. Pat. No. 8,063,717), which typically add one or more circuit elements (e.g. capacitor, inductor, or AW resonator) to the IEF design to enhance a particular circuit feature. This can be accomplished when the influences to the basic AW IEF circuit are minor enough that common computer optimization tools converge to produce an improved design versus the traditional AW IEF filter design. This is a stringent requirement for any circuit containing closely spaced resonances and anti-resonances, like the resonators used in an AW IEF filter, and thus permits only very minor variations to the basic AW IEF design and function. This is because a primary requirement for computer circuit optimization routines to converge to an improved circuit design solution is that the initial design be the same circuit structure as the final improved design and that the initial circuit element values be very close to the final values. Thus, the basic architecture of AW IEF filter designs has been limited to the simple paired resonator architecture and minor alterations to the basic AW ladder design, alterations made "after the fact" to this traditional circuit design. There is a need for improved microwave AW filters in terms of cost, loss, size and power handling for mobile communications.

SUMMARY OF THE INVENTION

In accordance with the present inventions, a method of designing an acoustic microwave filter in accordance with frequency response requirements is provided. The method comprises selecting a filter section based on the frequency response requirements. The filter section includes an input, and output, and a plurality of circuit elements between the input and the output. The plurality of circuit elements has at least two in-line acoustic resonators or at least two in-shunt acoustic resonators. In one method, each of the in-line resonator(s) or in-shunt resonator(s) is made on a single piezoelectric substrate.

The method may optionally comprise selecting the structural type of the circuit elements. For example, the structural type of each of the in-line resonator(s) or the in-shunt resonator(s) may be selected from one of a surface acoustic wave (SAW) resonator, a bulk acoustic wave (BAW) resonator, a film bulk acoustic resonator (FBAR), and a microelectromechanical system (MEMS) resonator.

The method further comprises selecting a value for each of the circuit elements based on the frequency response requirements, selecting a number of filter sections based on the frequency response requirements, and cascading the selected number of filter sections (which may be identical) to create a cascaded filter circuit design, such that at least one pair (perhaps even all pairs) of immediately adjacent filter sections are connected to each other via their inputs or their outputs.

In one method, the frequency response requirements comprise at least one of a passband and a stopband, and the filter section is selected based on the passband or stopband. The plurality of circuit elements may have a paired in-line resonator and in-shunt resonator, in which case, the values of the paired in-line resonator and in-shunt resonator may be selected to form the passband or stopband. If the frequency response requirements comprises a passband and a stopband, the values of the paired in-line resonator and in-shunt resonator may be selected to form the passband, the plurality of circuit elements may be another paired in-line resonator and in-shunt resonator, and the values of the other paired in-line resonator and in-shunt resonator may be selected to form the stopband.

An optional method further comprises mapping the frequency response requirements to a normalized design space, in which case, the circuit element values will be normalized values that are determined based on the mapped frequency response requirements, and then unmapping the normalized circuit element values of the cascaded filter circuit design to a real design space. In one embodiment, the plurality of circuit elements has a paired in-line resonator and in-shunt resonator, and a normalized resonant frequency of the in-shunt resonator is lower than a normalized anti-resonant frequency of the in-line resonator by about two to form a passband. In another embodiment, the plurality of circuit elements has a paired in-line resonator and in-shunt resonator, and a normalized anti-resonant frequency of the in-line resonator is lower than a normalized resonant frequency of the in-shunt resonator by about one to from a stopband.

The method further comprises adding parasitic effects to the cascaded filter circuit design to create a pre-optimized filter circuit design, inputting the pre-optimized filter circuit design into a filter optimizer, such as a computerized filter optimizer, to create a final filter circuit design, and constructing the acoustic microwave filter based on the final filter circuit design. An optional method further comprises combining like circuit elements that are electrically adjacent to each other in the cascaded filter design prior to adding parasitic effects to the cascaded filter design. Another optional method further comprises performing an element removal optimization of the pre-optimized filter circuit design to create the final filter circuit design.

In one method, the difference between the lowest resonant frequency and the highest resonant frequency of a plurality of resonators in the final filter circuit design is at least 1.25 times, perhaps at least two times, the difference between the resonant frequency and the anti-resonant frequency of the resonator with the highest resonant frequency in the plurality of resonators. In another method, a local minimum or a local maximum of a return loss magnitude of the final filter circuit design is at least once, perhaps 1.25 times, and even perhaps two times, the separation between the resonant frequency and the anti-resonant frequency of the resonator with the highest resonant frequency in the final filter circuit design.

Other and further aspects and features of the invention will be evident from reading the following detailed description of the preferred embodiments, which are intended to illustrate, not limit, the invention.

BRIEF DESCRIPTION OF THE DRAWINGS

The drawings illustrate the design and utility of preferred embodiments of the present invention, in which similar elements are referred to by common reference numerals. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE EMBODIMENTS

The present disclosure describes an image technique for designing acoustic wave (AW) microwave filters (such as surface acoustic wave (SAW), bulk acoustic wave (BAW), film bulk acoustic resonator (FBAR), microelectromechanical system (MEMS) filters)). In contrast to the prior art image design techniques, which are limited to the use of a simple paired resonator architecture in each cascaded section of the filter design, the image design technique described herein uses a more complex circuit element architecture in each cascaded section of the filter design. The increased design complexity enabled by this image design technique can lead to designs with improved performance, such as improved insertion loss, improved rejection and/or lower cost.

The AW microwave filter described herein exhibits a frequency response with a single passband and a single stopband, which is particularly useful in telecommunication system duplexers where a passband with a closely spaced stopband is required. For example, with reference to FIG. 1, a telecommunications system 10 for use in a mobile communications device may include a transceiver 12 capable of transmitting and receiving wireless signals, and a controller/processor 14 capable of controlling the functions of the transceiver 12. The transceiver 12 generally comprises a broadband antenna 16, a duplexer 18 having a transmit filter 24 and a receive filter 26, a transmitter 20 coupled to the antenna 16 via the transmit filter 24 of the duplexer 18, and a receiver 22 coupled to the antenna 16 via the receive filter 26 of the duplexer 18.

Figure 1:
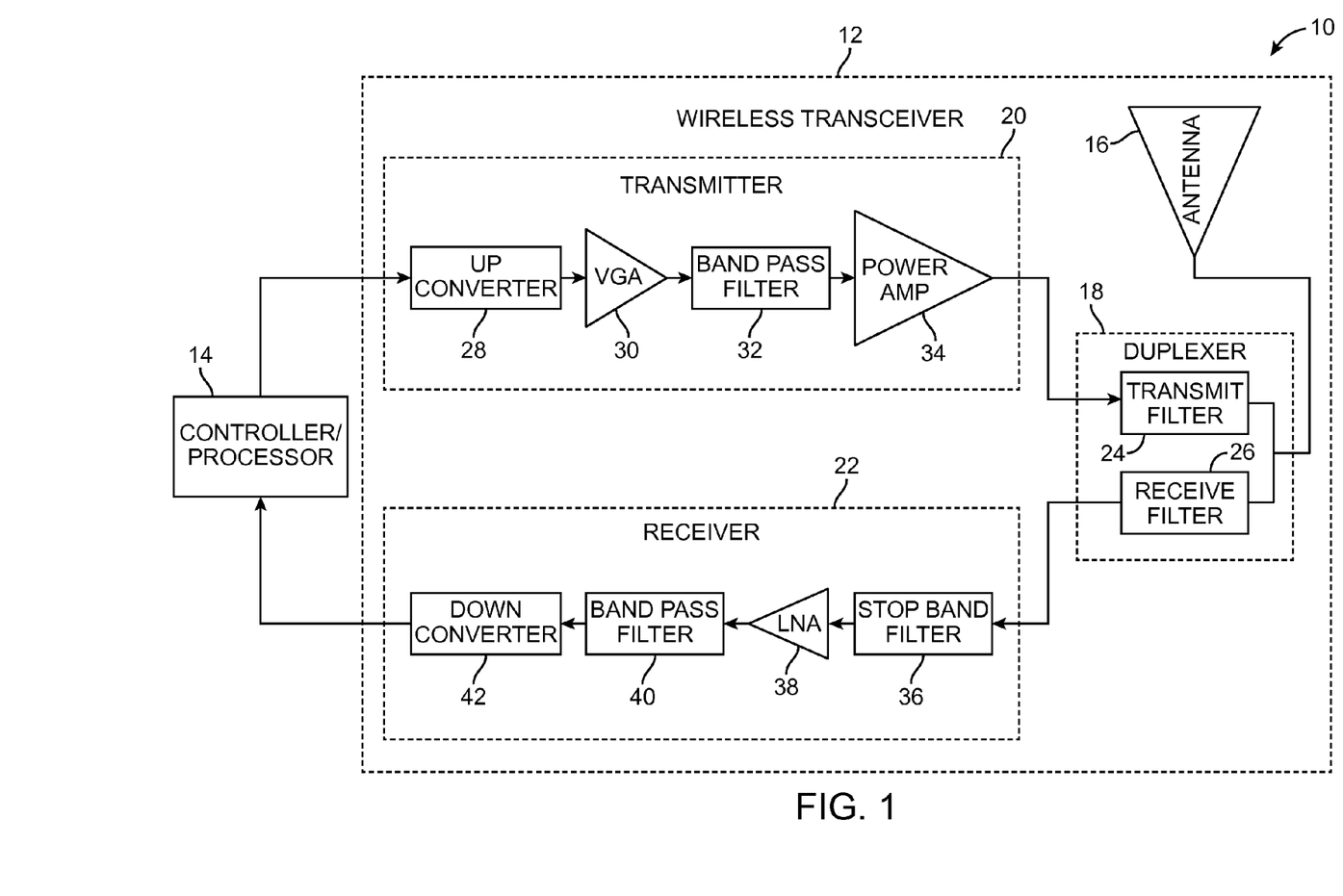
FIG. 1 is a block diagram of a wireless telecommunications system.

The transmitter 20 includes an upconverter 28 configured for converting a baseband signal provided by the controller/processor 14 to a radio frequency (RF) signal, a variable gain amplifier (VGA) 30 configured for amplifying the RF signal, a bandpass filter 32 configured for outputting the RF signal at an operating frequency selected by the controller/processor 14, and a power amplifier 34 configured for amplifying the filtered RF signal, which is then provided to the antenna 16 via the transmit filter 24 of the duplexer 18.

The receiver 22 includes a notch or stopband filter 36 configured for rejecting transmit signal interference from the RF signal input from the antenna 16 via the receiver filter 26, a low noise amplifier (LNA) 38 configured for amplifying the RF signal from the stop band filter 36 with a relatively low noise, a tunable bandpass filter 40 configured for outputting the amplified RF signal at a frequency selected by the controller/processor 14, and a downconverter 42 configured for downconverting the RF signal to a baseband signal that is provided to the controller/processor 14. Alternatively, the function of rejecting transmit signal interference performed by the stop-band filter 36 can instead be performed by the duplexer 18. Or, the power amplifier 34 of the transmitter 20 can be designed to reduce the transmit signal interference.

It should be appreciated that the block diagram illustrated in FIG. 1 is functional in a nature, and that several functions can be performed by one electronic component or one function can be performed by several electronic components. For example, the functions performed by the up converter 28, VGA 30, bandpass filter 40, downconverter 42, and controller/processor 14 are oftentimes performed by a single transceiver chip. The function of the bandpass filter 32 can be into the power amplifier 34 and the transmit filter 24 of the duplexer 18.

The exemplary image design technique described herein is used to design acoustic microwave filters for the front-end of the telecommunications system 10, and in particular the transmit filter 24 of the duplexer 18, although the same technique can be used to design acoustic microwave filters for the receive filter 26 of the duplexer 18 and for other RF filters.

Figure 2:
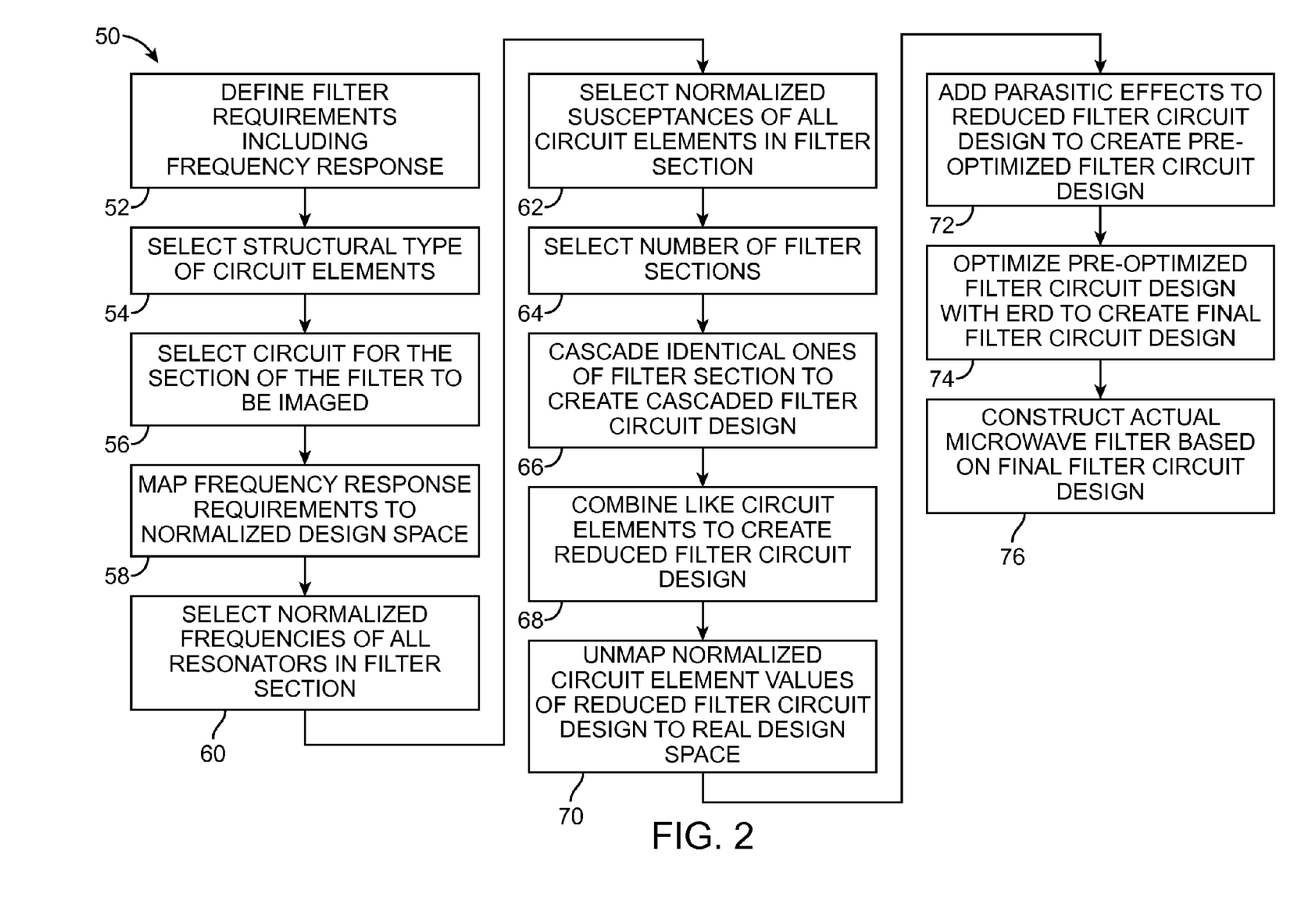
FIG. 2 is a flow diagram illustrating an image technique used to design an acoustic filter in accordance with one method of the present inventions.

Referring now to FIG. 2, one exemplary technique 50 for designing an AW microwave filter will be described. First, the filter requirements, which comprise the frequency response requirements (including passband, return loss, insertion loss, rejection, linearity, noise figure, input and output impedances, etc.), as well as size and cost requirements, and environmental requirements, such as operating temperature range, vibration, failure rate, etc., are established by the application of the filter and the user (step 52).

Next, the structural types of circuit elements to be used in the AW filter are selected; for example, the structural type of resonator (SAW, BAW, FBAR, MEMS, etc.) and the types of inductor, capacitor, and switch, along with the materials to be used to fabricate these circuit elements, including the packaging and assembly techniques for fabricating the filter, are selected (step 54). In the particular example described herein, the selection of circuit element types are SAW resonators constructed on 42-degree XY-cut LiTaO3 substrates and capacitors integrated onto the 42-degree XY-cut LiTaO3 substrate.

Then, the passband(s) and stopband(s) are chosen from the frequency response requirements, and the circuit for the section of the filter to be designed is selected (step 56). First based on the requirements passbands and stopbands are identified. The filter section is the basic building block of the filter, and is selected based on the passband(s) and/or stopband(s). For example, paired in-line resonator (i.e., connected in series)/in-shunt resonators (i.e., connected in parallel) may be selected for each passband(s) and/or stopband(s), and then connected in-line to form the filter section. The filter section may also comprise circuit elements other than resonators, such as capacitors, inductors, and/or switches.

Figure 3:
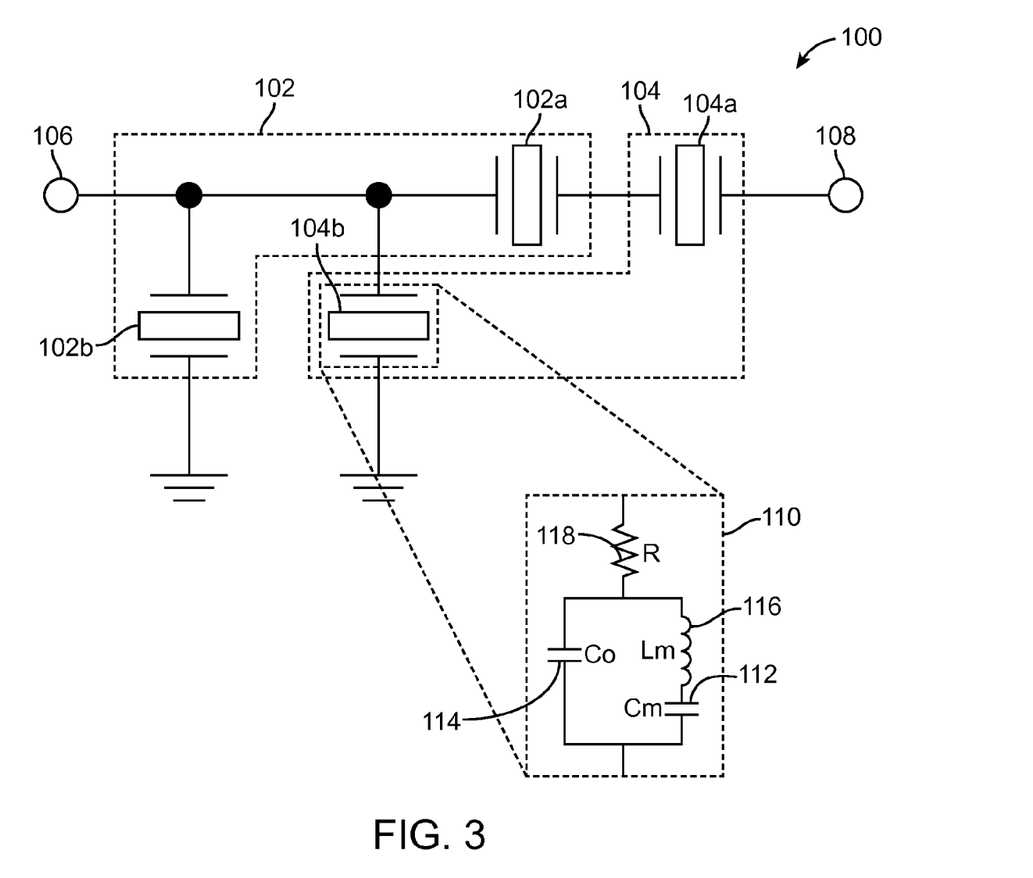
FIG. 3 is a schematic diagram of one filter section that can be selected in accordance with the image technique of FIG. 2.

One such embodiment of a filter section 100 is illustrated in FIG. 3. The filter section 100 comprises a resonator pair 102 consisting of an in-line resonator 102a and an in-shunt resonator 102b, and a resonator pair 104 consisting of an in-line resonator 104a and an in-shunt resonator 104b. The two resonator pairs 102, 104 are coupled to each other in-line as shown, and respectively correspond to a passband and a stopband of the frequency response requirements. The filter section 100 also comprises an input terminal 106 and an output terminal 108.

Each of the acoustic resonators 102a, 102b, 104a, 104b may be described by a modified Butterworth-Van Dyke (MBVD) model 110. MBVD models 110 may also describe SAW resonators, which may be fabricated by disposing interdigital transducers (IDTs) on a piezoelectric substrate, such as crystalline Quartz, Lithium Niobate (LiNbO$_3$), Lithium Tantalate (LiTaO$_3$) crystals or BAW (including FBAR) resonators or MEMS resonators. Each MBVD model 110 includes a motional capacitance $C_m$ 112, a static capacitance $C_0$ 114, a motional inductance $L_m$ 116, and a resistance R 118. The motional capacitance $C_m$ 112 and motional inductance $L_m$ 116 may result from the interactions of electrical and acoustical behavior, and thus, may be referred to as the motional arm of the MBVD model 110. The static capacitance $C_0$ 114 may result from the capacitance of the structure, and thus, may be referred to as the static (non-motional) capacitance of the MBVD model 110. The resistance R 118 may result from the electrical resistance of the acoustic resonator. The parameters are related by the following equations:

$$\omega_R = \frac{1}{\sqrt{L_m C_m}}; \quad [1]$$

$$\frac{\omega_A}{\omega_R} = \sqrt{1 + \frac{1}{\gamma}}, \quad [2]$$

where $\omega_R$ and $\omega_A$ may be the respective resonance and anti-resonance frequencies for any given acoustic resonator, and gamma γ may depend on a material's property, which may be further defined by:

$$\frac{C_0}{C_m} = \gamma. \quad [3]$$

Typical γ values may range from about 12 to about 18 for 42-degree X Y cut LiTaO$_3$.

The resonant frequency $\omega_R$ of an acoustic resonator means the frequency where the magnitude of the impedance reaches a local minimum and the phase of the impedance crosses zero. The anti-resonant frequency $\omega_A$ of an acoustic resonator means the frequency where the magnitude of the impedance reaches a local maximum and the phase of the impedance crosses zero.

It can be appreciated from equation [1] that the resonant frequency of each of the acoustic resonators will depend on the motional arm of the MBVD model 110, whereas the filter characteristics (e.g., bandwidth) will be strongly influenced by γ in equation [2]. The Quality factor (Q) for an acoustic resonator 102 may be an important figure of merit in acoustic filter design, relating to the loss of the element within the filter. Q of a circuit element represents the ratio of the energy stored per cycle to the energy dissipated per cycle. The Q factor models the real loss in each acoustic resonator, and generally more than one Q factor may be required to describe the loss in an acoustic resonator. Q factors may be defined as follows for the filter examples. The motional capacitance $C_m$ 112 may have an associated Q defined as $QC_m=10^8$; the static capacitance $C_0$ 114 may have an associated Q defined as $QC_0=200$; and motional inductance $L_m$ 116 may have an associated Q defined as $QL_m=1000$. Circuit designers may typically characterize SAW resonators by resonant frequency $\omega_R$, static capacitance $C_0$, gamma γ, and Quality factor $QL_m$. For commercial applications, $QL_m$ may be about 1000 for SAW resonators, and about 3000 for BAW resonators.

Referring back to the FIG. 2, the frequency response requirements are then mapped to a normalized design space (step 58). The mapping may be performed using a suitable algorithm, such as a square-root/quadratic mapping technique (see George L. Matthaei, Microwave Filters, Impedance-Matching Networks, and Coupling Structures, McGraw-Hill Book Company, pp. 95-97, 438-440 (1964), or a logarithmic/exponential mapping technique more suitable to acoustic wave resonators.

One attractive logarithmic mapping technique uses the following equations:

$$\Omega = \ln\left(\frac{\omega^2}{\omega_p^2}\right) / \ln\left(1 + \frac{1}{\gamma}\right), \quad [4]$$

$$|\Omega_R - \Omega_A| = 1 \quad [5]$$

where $2\pi\omega_p$ is the geometric center frequency of the passband or stopband, $2\pi\omega$ is the real frequency, $\Omega$ is the mapped frequency, γ is the ratio of the static to the motional capacitance of the resonator, and $\Omega_R$ is the mapped resonant frequency of the resonator, and $\Omega_A$ is the mapped anti-resonant frequency of the resonator.

The relationship between the mapped anti-resonant frequency of the in-line resonator and the mapped resonant frequency of the in-shunt resonator of a resonator pair can be conveniently used to define a desired shape of a frequency response in accordance with the following equation:

$$\beta = \Omega_A^{IL} - \Omega_R^{IS} \quad [6]$$

where $\Omega_A^{IL}$ is the mapped anti-resonant frequency of the in-line resonator, $\Omega_R^{IS}$ is the mapped resonant frequency of the in-shunt resonator, and β is a frequency separation parameter that defines the shape of the frequency response. The choice of β within the filter section determines if a passband, stopband or null band is formed.

Figure 4A:
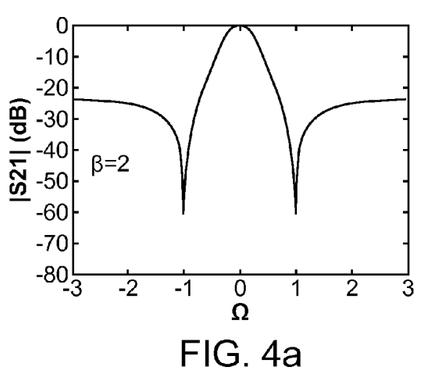
FIGS. 4a-4e are frequency response plots illustrating different beta values for achieving different band types in the filter section of FIG. 3.
Figure 4B:
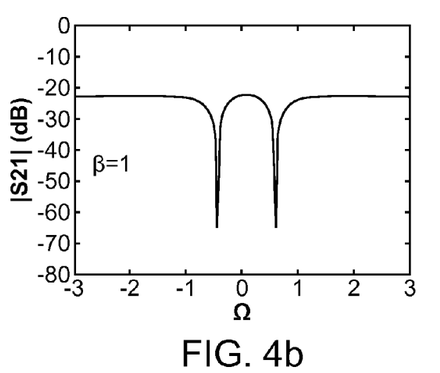
Figure 4C:
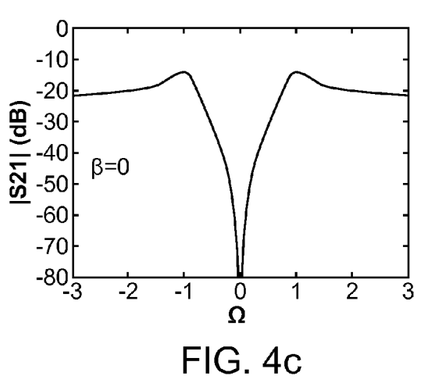
Figure 4D:
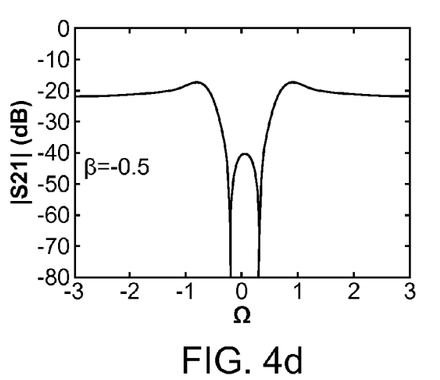
Figure 4E:
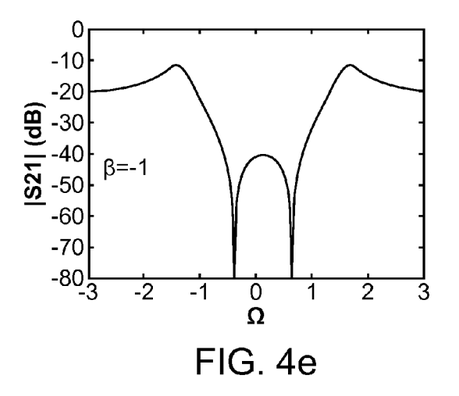

For example, FIGS. 4a-4e respectively illustrate five different types of frequency responses for a pair of in-line/in-shunt resonators. In particular, when β~2, the frequency response includes a passband, as illustrated in FIG. 4a. In this case, the in-shunt resonator has a normalized resonant frequency of −1, and the in-line resonator has a normalized anti-resonant frequency of +1 (and thus, a normalized resonant frequency of 0). When β~1, the frequency response includes a nullband, as illustrated in FIG. 4b. In this case, the in-shunt resonator has a normalized resonant frequency of −0.5, and the in-line resonator has a normalized anti-resonant frequency of +0.5 (and thus, a normalized resonant frequency of −0.5). When β~0, the frequency response includes a narrow stopband, as illustrated in FIG. 4c. In this case, the in-shunt resonator has a normalized resonant frequency of 0, and the in-line resonator has a normalized anti-resonant frequency of 0 (and thus, a normalized resonant frequency of 1). When β~−0.5, the frequency response includes a wider stopband, as illustrated in FIG. 4d. In this case, the in-shunt resonator has a normalized resonant frequency of 0.25, and the in-line resonator has a normalized anti-resonant frequency of −0.25 (and thus, a normalized resonant frequency of 0.75). When β~−1, the frequency response includes an even wider stopband, as illustrated in FIG. 4e. In this case, the in-shunt resonator has a normalized resonant frequency of 0.5, and the in-line resonator has a normalized anti-resonant frequency of −0.5 (and thus, a normalized resonant frequency of 0.5).

Using these principles, the frequency response requirements, and the identified passbands and stopbands, the normalized frequencies of all the resonators in the filter section 100 shown in FIG. 3 are determined (step 60). For example, if the frequency response requirements include a passband similar to that of the frequency response illustrated in FIG. 4a (β~2) the normalized anti-resonant frequency of the in-line resonator 102a can be selected to be +1, and the normalized resonant frequency of the in-shunt resonator 102b can be selected to be −1. If the frequency response requirements include a stopband similar to that of the frequency response illustrated in FIG. 4e (β~−1), the normalized anti-resonant frequency of the in-line resonator 104a can be selected to be −0.5, and the normalized resonant frequency of the in-shunt resonator 104b can be selected to be 0.5. It should be appreciated that the frequencies may be renormalized for each passband and each stopband.

Next, the normalized susceptance values of the circuit elements (in the case of the resonators, the normalized susceptance is proportional to their static capacitances $C'_0$) can be selected at the center frequency of each passband and each stopband based on the inherent relationship between the normalized susceptance values of the in-line and in-shunt branches of a filter section, as well as the desired band rejection requirement for the particular filter section (step 62). In particular, assuming that logarithmic/exponential mapping of equations [4] and [5] are used, it follows that for each passband and each stopband, $$B'_0{}^{(IS)} * B'_0{}^{(IL)} = 1; \qquad [7]$$

where, for each resonator pair, $B'_0{}^{(IL)}$ is the normalized susceptance for the in-line branch, e.g., the in-line resonator 102a of the filter pair 102 illustrated in FIG. 3, and $B'_0{}^{(IS)}$ is the normalized susceptance for the in-shunt branch, e.g., the in-shunt resonator 102b of the filter pair 102. Furthermore, the ratio $B'_0{}^{(IS)}/B'_0{}^{(IL)}$ can be related to the signal rejection of the filter pair in accordance with the teachings of Ken-ya Hashimoto, Surface Acoustic Wave Devices in Telecommunications, Springer, 2000, chapter 5.4—"Impedance Element Filters" especially figures 5.41 and 5.42.

Using equation [7] and the signal rejection relationship to the ratio $B'_0{}^{(IS)}/B'_0{}^{(IL)}$, the susceptance values for the circuit elements can be selected. For example, with reference back to FIG. 3, the normalized susceptance values $B'_0{}^{(IL)}/B'_0{}^{(IS)}$ of the in-line resonator 102a and the in-shunt resonator 102b can be selected in a manner that adheres to equation [7] and generates an expected passband frequency response having a rejection due to the passband elements equal to the desired rejection of the passband part of the filter section. Likewise, the normalized susceptance values $B'_0{}^{(IS)}$, $B'_0{}^{(IS)}$, of the in-line resonator 104a and the in-shunt resonator 104b can be selected in a manner that adheres to equation [7] and generates an expected frequency response having a rejection in the stopband equal to the remaining portion of the desired signal rejection of the filter section. For example, if the desired signal rejection of the filter section is 10 dB, the susceptance values of the in-line resonator 102a and the in-shunt resonator 102b corresponding to the passband may be selected to contribute 5 dB of rejection, and the susceptance value of the in-line resonator 102a and the in-shunt resonator 102b corresponding to the stopband may contribute 5 dB of rejection.

Next, the number of filter sections to be used in the filter is selected based on the frequency response requirements, and in this case, the desired rejection of the filter (step 64). For example, if the desired rejection is greater than 40 dB, and the rejection for each filter section is 10 dB, then the selected number of circuit sections will preferably be at least four.

Figure 5:
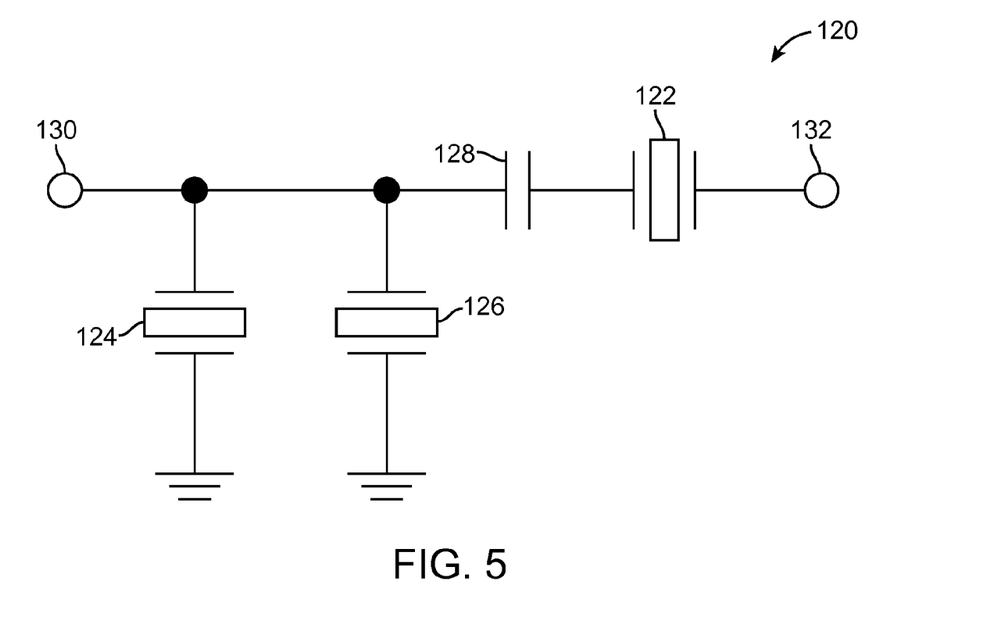
FIG. 5 is a schematic diagram of another filter section that can be selected in accordance with the image technique of FIG. 2.

It should be appreciated that although two pairs of resonators have been selected for the filter section in step 56 to provide a passband and a stopband in the frequency response of the filter, if the passband and stopband are close enough in frequency, one of the resonators can aid in creating both the passband and stopband. For example, an alternative filter section 120 is illustrated in FIG. 5. The filter section 120 comprises an in-line resonator 122, two in-shunt resonators 124, 126, and a capacitor 128. The in-line resonator 122 may be paired with the in-shunt resonator 124 to form a passband, and can also be paired with the in-shunt resonator 126 to form the stopband. That is, the in-line resonator 122 is shared by the respective in-shunt resonators 124, 126 to form both the passband and the stopband. The filter section 120 comprises an input terminal 130 and an output terminal 132.

Figure 6:
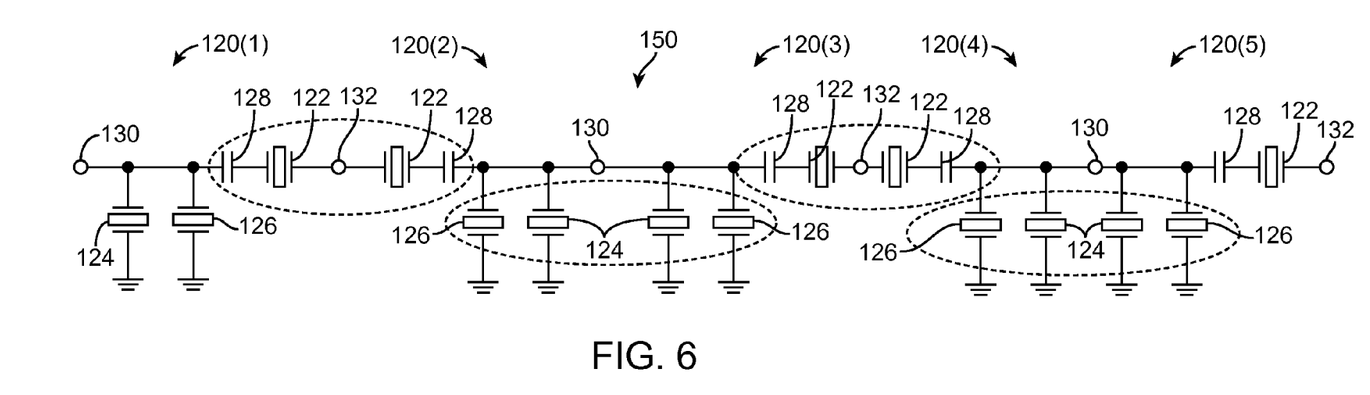
FIG. 6 is a schematic diagram of a cascaded filter circuit design created by cascading identical ones of the other filter section illustrated in FIG. 5 in accordance with the image technique of FIG. 2.

Regardless of the circuit of the filter section selected, the selected number of identical ones of the filter section are cascaded to create a cascaded filter circuit design, such that at least an immediately adjacent pair of filter sections are connected to each other via their inputs or their outputs (step 66). For example, if the filter section 120 illustrated in FIG. 5 is selected, it can be cascaded five times to create the cascaded filter circuit design 150 illustrated in FIG. 6. As there shown, second and fourth filter sections 120(2), 120(4) are reversed, such that the output terminal 132 of the second filter section 120(2) is connected to the output terminal 132 of the first filter section 120(1), the input terminal 130 of the second filter section 120(2) is connected to the input terminal 130 of the third filter section 120(3), the output terminal 132 of the fourth filter section 120(4) is connected to the output terminal 132 of the third filter section 120(3), and the input terminal 130 of the fourth filter section 120(4) is connected to the input terminal 130 of the fifth filter section 120(5). In an alternative embodiment, some or all of the filter sections used in the cascaded filter circuit design are not identical to each other, but rather are derived from the initial filter section 120 using an M-derived image method disclosed in Otto J. Zobel, Theory and Design of Uniform and Composite Electric Wave-Filters, The Bell System Technical Journal, Volume II, No. 1 (January 1923)).

Next, like circuit elements that are electrically adjacent to each other in the cascaded filter design are combined to create a reduced cascaded filter design 250 (step 68). For the purposes of this specification, in-line circuit elements are "electrically adjacent" to each other if there are no shunted electrical paths between them, and in-shunt circuit elements are "electrically adjacent" to each other if their terminals are shorted together.

Figure 7:
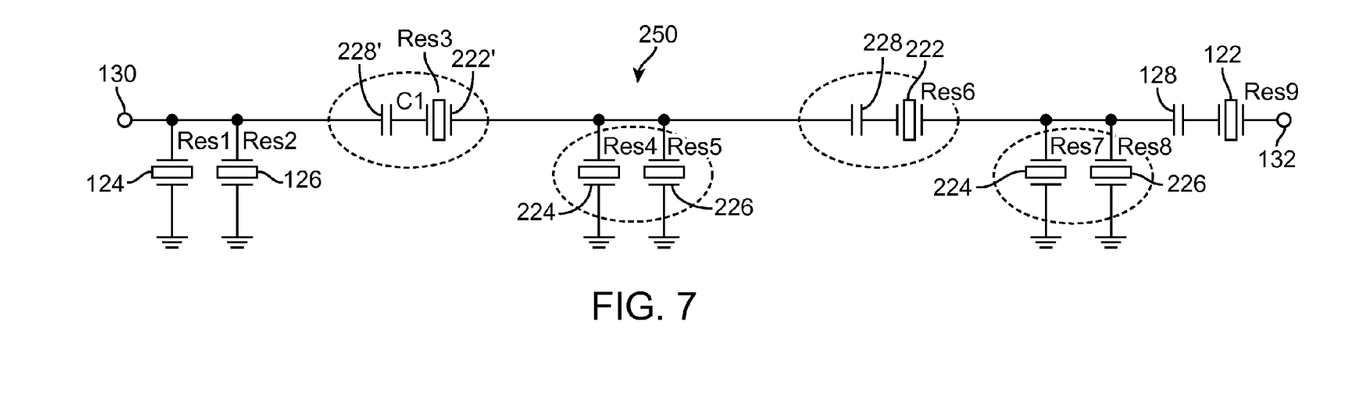
FIG. 7 is a schematic diagram of an initial filter circuit design created by combining like circuit elements in the cascaded filter circuit design of FIG. 6 in accordance with the image technique of FIG. 2.

For example, as illustrated in FIG. 7, the identical in-line resonators 122 of the respective first and second filter sections 120(1), 120(2) can be combined together into a single in-line resonator 222 having the same normalized resonant frequency, but half the normalized static capacitance, as any one of the original in-line resonators 122, and the identical capacitors 128 of the respective first and second filter sections 120 (1), 120(2) can be combined together into a single capacitor 228 having half the normalized capacitance as any one of the original capacitors 128. Likewise, the identical in-line resonators 122 of the respective third and fourth filter sections 120(3), 120(4) can be combined together into a single in-line resonator 222 having the same normalized resonant frequency, but half the normalized static capacitance, as any one of the original in-line resonators 122, and the identical capacitors 128 of the respective third and fourth filter sections 120(3), 120(4) can be combined together into a single capacitor 228 having half the normalized capacitance as any one of the original capacitors 128.

The identical in-shunt resonators 124 of the respective second and third filter sections 120(2), 120(3) can be combined together into two single in-shunt resonators 224 having the same normalized resonant frequency, but twice the normalized static capacitance, as any one of the original in-shunt resonators 124, and the identical in-shunt resonators 126 of the respective second and third filter sections 120(3), 120(4) can be combined together into a single in-shunt resonator 226 having the same normalized resonant frequency, but twice the normalized static capacitance, as any one of the original in-shunt resonators 126. Likewise, the identical in-shunt resonators 124 of the respective fourth and fifth filter sections 120(4), 120(5) can be combined together into two single in-shunt resonators 224 having the same normalized resonant frequency, but twice the normalized static capacitance, as any one of the original in-shunt resonators 124, and the identical in-shunt resonators 126 of the respective fourth and fifth filter sections 120(4), 120(5) can be combined together into a single in-shunt resonator 226 having the same normalized resonant frequency, but twice the normalized static capacitance, as any one of the original in-shunt resonators 126.

Next, the normalized circuit element values of the reduced filter circuit design are unmapped to a real design space in accordance with the inverse of the mapping technique initially used to map the frequency response requirements to the normalized design space (step 70). For example, if the logarithmic mapping technique of equation [4] was used to map the frequency response requirements to the normalized space, then the following logarithmic unmapping equation can be used to unmap the normalized circuit element values to the real design space:

$$\omega = w_p \left(1 + \frac{1}{\gamma}\right)^{\Omega/2} \quad [8]$$

Figure 8A:
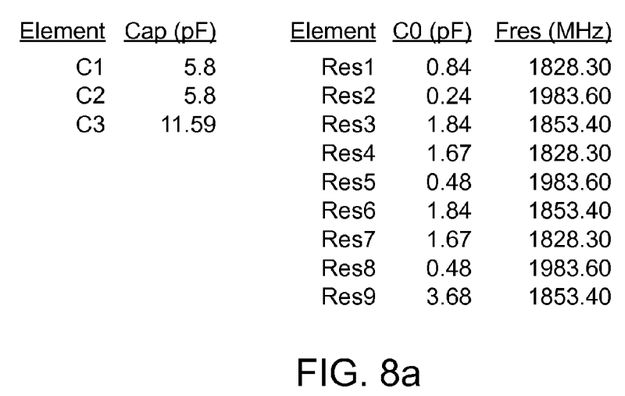
FIG. 8a is a table illustrating resonant frequency values and static capacitance values of an initial filter circuit design of FIG. 7 in accordance with the image technique of FIG. 2.
Figure 8B:
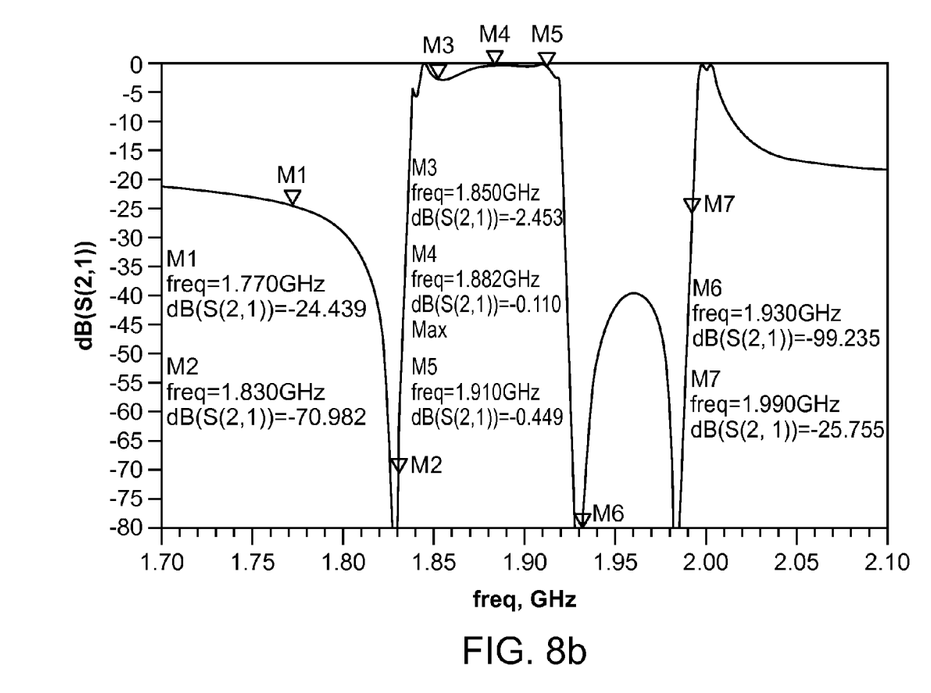
FIG. 8b is a frequency response plot of the pre-optimized filter circuit design, particularly showing transmission zeroes.

This filter design is the initial filter design. Given the frequency response requirements (passband: 1850 MHz to 1910 MHz with Insertion Loss <1.5 dB; stopband: 1930 MHz to 1990 MHz with >40 dB rejection), and a selection of circuit element types consisting of SAW resonators constructed on 42-degree XY-cut LiTaO3 substrates and capacitors integrated onto 42-degree XY-cut LiTaO3 substrates, and after unmapping the initial filter circuit design 250, the resonant frequencies $\omega_R$ and static capacitances $C_0$ for each resonator, and the capacitances of the capacitors were selected, as shown in FIG. 8a, which when simulated, resulted in the frequency response illustrated in FIG. 8b.

Figure 9:
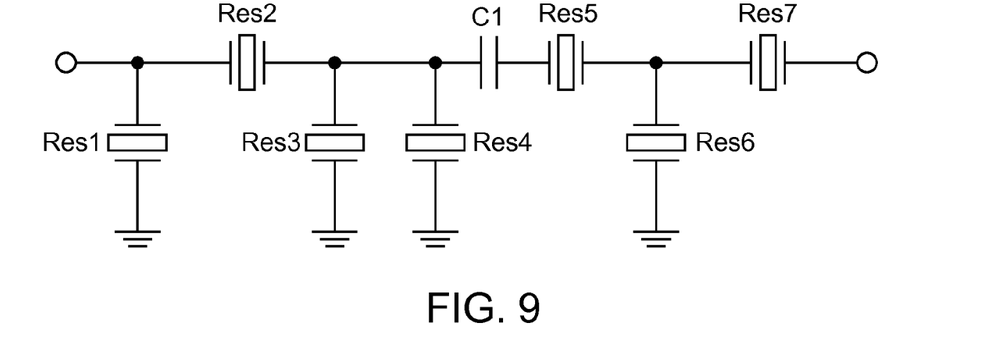
FIG. 9 is a schematic diagram of an optimized filter circuit design created by inputting the pre-optimized filter circuit design into a computerized filter optimizer and performing an element removal design technique in accordance with the image technique of FIG. 2.
Figure 10A:
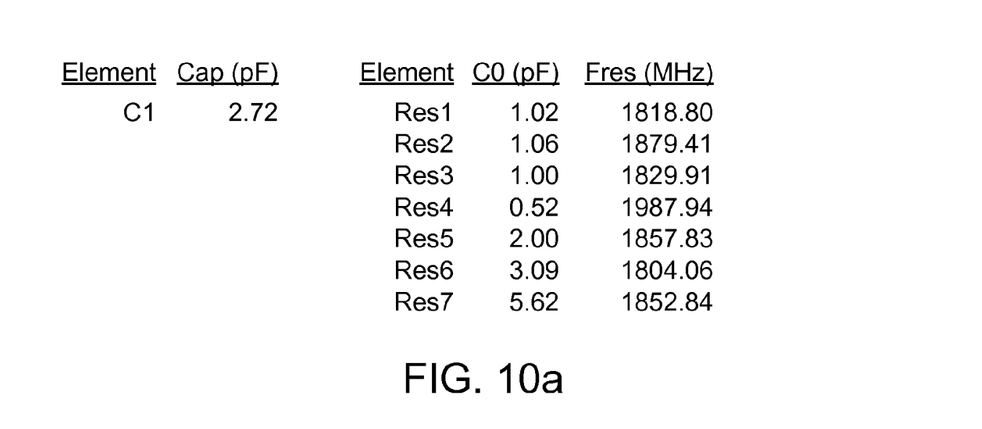
FIG. 10a is a table illustrating resonant frequency values and static capacitance values of the optimized filter circuit design of FIG. 9.
Figure 10B:
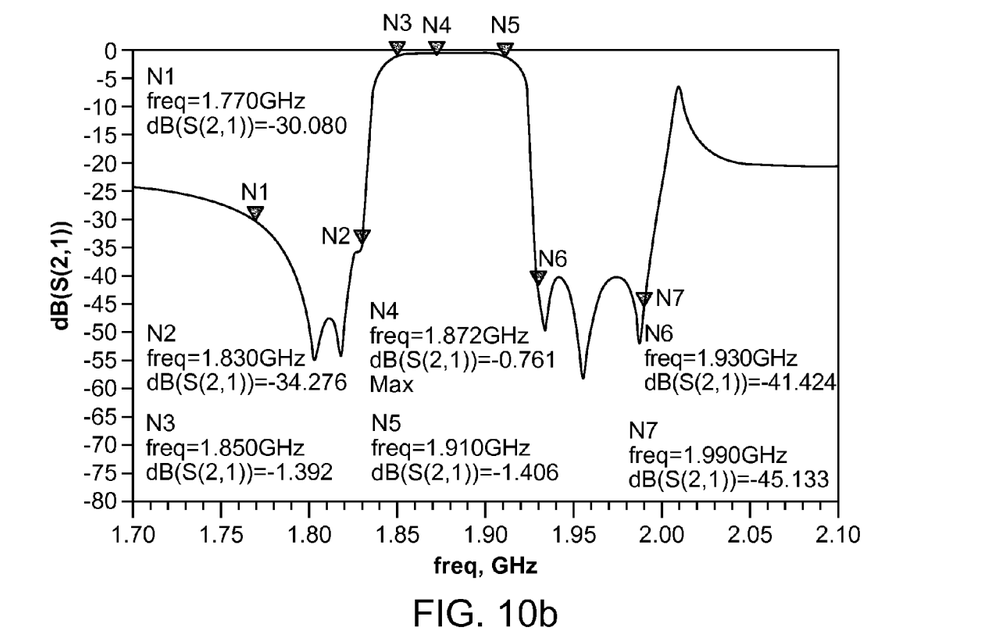
FIG. 10b is a frequency response plot of the optimized filter circuit design of FIG. 9, particularly showing transmission zeroes.

Next, parasitic effects are added to the initial filter circuit design 250 using the following parameters ($QC_0$=200, Qcap=200, $QL_m$=1000, and Rs=0.5 ohms), to create a pre-optimized filter circuit design (step 72). Then, the pre-optimized filter circuit design is input into a computerized filter optimizer to create a final filter circuit design (step 74). In an optional method, an element removal design (ERD) technique is implemented during the optimization, where unnecessary or "vanishing" circuit elements are removed or reduced to simpler circuit elements, resulting in the final filter circuit design illustrated in FIG. 9. The ERD technique is described in U.S. Provisional Patent Application Ser. No. 61/802,114, entitled "Element Removal Design in Microwave Filters," which is expressly incorporated herein by reference. The optimization and ERD technique resulted in resonant frequencies $\omega_R$ and static capacitances $C_0$ for each resonator, and capacitances of the capacitors, as shown in FIG. 10a, which when simulated, resulted in the frequency response illustrated in FIG. 10b, which meets the target frequency response requirements.

Notably, it is expected that multi-band filters designed in accordance with the image design technique illustrated in FIG. 2 will have resonators with resonant frequencies spanning a range that is relatively large in contrast to microwave acoustic filters designed in accordance with prior art image design techniques.

For example, one measure to which the span of resonant frequencies can be compared is the frequency separation of the resonator with the largest resonant frequency. The frequency separation of an acoustic resonator means the difference between its resonant frequency and its anti-resonant frequency. The percentage separation of an acoustic wave resonator is the percentage frequency separation between its resonant frequency and anti-resonant frequency, and can be computed, as follows:

$$\text{percentage separation} = \sqrt{1 + \left(\frac{1}{\gamma}\right)} - 1 \quad [9]$$

where $\gamma$ is the ratio of the static to the motional capacitance of the resonator (equation [3]), as determined by the material properties of the piezoelectric material and modified by the geometry of the device.

For a 42-degree XY-cut LiTaO3 substrate, $\gamma$ is greater than about 12. The parasitic capacitance from the realization of the acoustic resonator may increase the $\gamma$ and therefore decrease the percentage separation, while parasitic inductance may effectively decrease $\gamma$. In this example, for $\gamma=12$, the percentage separation is approximately 4.1%, and therefore, the separation has a maximum value of approximately 81 MHz at the highest resonant frequency among the resonators in FIG. 8a (1988 MHz for Res4). In contrast to the frequency separation of an acoustic resonator, the "frequency difference" between two acoustic resonators means the absolute frequency difference between the resonant frequencies of the two resonators. The frequency difference between the highest and lowest resonator shown in FIG. 8a is 184 MHz or 2.27 times the maximum frequency separation. In this example, the average frequency difference between all possible pairs of resonators in FIG. 8a is approximately 0.9 times the maximum frequency separation. The square root of the variance of the difference between the resonant frequencies of pairs of resonators is 56 MHz or 0.69 times the maximum frequency separation. The frequency differences between 4 of the total 21 possible pairs of resonators exceed the maximum frequency separation.

Thus, it is expected that the difference between the lowest resonant frequency and the highest resonant frequency of the resonators in the final filter circuit design will be at least 1.25 times, and in many cases, at least twice, the separation between the resonant frequency and the anti-resonant frequency of the resonator with the highest resonant frequency.

It is also expected that multi-band filters designed in accordance with the image design technique illustrated in FIG. 2 will have reflection zeroes that are located relatively far from the passband in contrast to filters designed in accordance with prior art image design techniques, wherein the reflection zeroes are confined to the passband or very close to it.

Figure 10C:
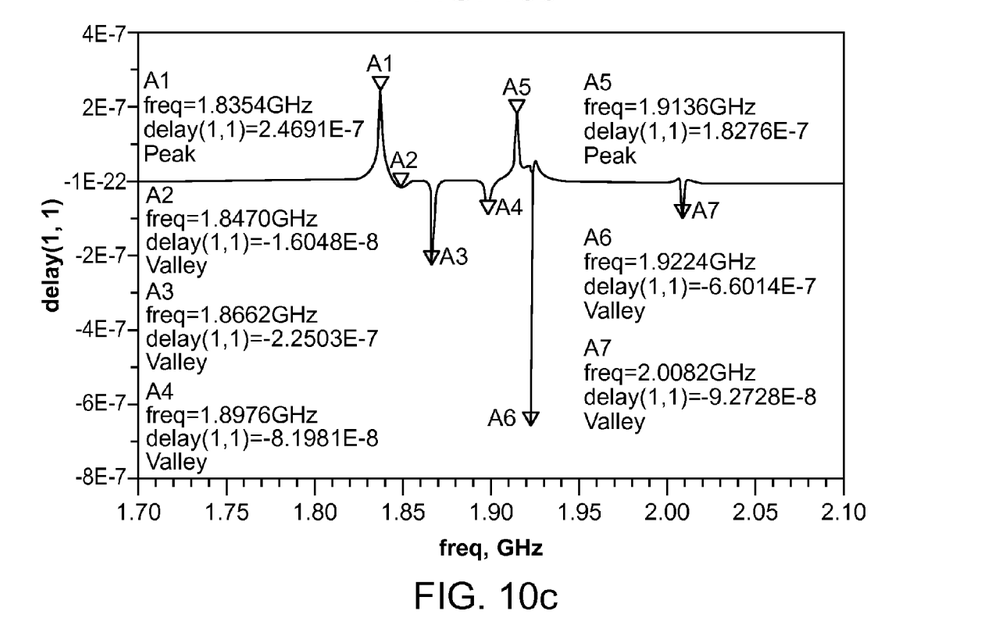
FIG. 10c is a frequency response plot of the optimized filter circuit design of FIG. 9, particularly showing reflection zeroes.

In particular, reflection zeroes occur at frequencies where the local return loss (and/or S11) minima and local insertion loss (and/or S21) maxima coincide to within less than about five percent of the maximum frequency separation—less than about 4 MHz for this example. Alternatively, reflection zeroes occur at local minima and at local maxima of the delay of S11. As can be seen from FIG. 10c, some reflection zeroes (in particular, the reflection zeroes corresponding to markers A1 and A7) are located outside and far from the passband (1850 MHz to 1910 MHz). The frequency difference between a reflection zero and the nearest passband edge may be greater than once, perhaps greater than 1.25 times, and perhaps greater than twice, the maximum frequency separation. In this particular example, the reflection zero corresponding to marker A7 is approximately 91 MHz from the upper edge of the passband (i.e., approximately 1.1 times the maximum frequency separation of 81 MHz). The passband for this example is 60 MHz wide. Relative to a passband width, the reflection zeroes, as shown in FIG. 10c, are 25% and 5% below the lower edge of the passband and 6% and 21% above the upper edge of the passband and are contiguous with the other reflection zeroes in the passband. Also, one reflection zero, at marker A7, is not contiguous with the passband reflection zeroes and is 164% above the upper edge of the passband. The insertion loss of the final filter circuit design is preferably less than 3 dB.

Referring back to FIG. 2, once the final filter circuit design is achieved, an actual microwave filter is constructed based on the final filter circuit design (step 76). Preferably, the circuit element values of the actual microwave filter will match the corresponding circuit element values in the final filter circuit design.

Although particular embodiments of the present invention have been shown and described, it should be understood that the above discussion is not intended to limit the present invention to these embodiments. It will be obvious to those skilled in the art that various changes and modifications may be made without departing from the spirit and scope of the present invention. For example, the present invention has applications well beyond filters with a single input and output, and particular embodiments of the present invention may be used to form duplexers, multiplexers, channelizers, reactive switches, etc., where low-loss selective circuits may be used. Thus, the present invention is intended to cover alternatives, modifications, and equivalents that may fall within the spirit and scope of the present invention as defined by the claims.

What is claimed is:

1. A method of designing an acoustic microwave filter in accordance with frequency response requirements, comprising:
   selecting a filter section based on the frequency response requirements, wherein the filter section includes an input, an output, and a plurality of circuit elements between the input and the output, the plurality of circuit elements having a paired in-line acoustic resonator and in-shunt acoustic resonator, and further having at least one of an additional in-line acoustic resonator and in-shunt resonator;
   selecting a value for each of the circuit elements based on the frequency response requirements;
   selecting a number of filter sections based on the frequency response requirements, each of the filter sections including an input and an output;
   cascading the selected number of filter sections to create a cascaded filter circuit design, such that the inputs of at least one pair of immediately adjacent filter sections are connected to each other or the outputs of at least one pair of immediately adjacent filter sections are connected to each other;
   adding parasitic effects to the cascaded filter circuit design to create a pre-optimized filter circuit design;
   inputting the pre-optimized filter circuit design into a filter optimizer to create a final filter circuit design; and
   fabricating an actual acoustic microwave filter based on the final filter circuit design.

2. The method of claim 1, further comprising selecting the structural type of each of the resonators from one of a surface acoustic wave (SAW) resonator, a bulk acoustic wave (BAW) resonator, a film bulk acoustic resonator (FBAR), and a microelectromechanical system (MEMS) resonator.

3. The method of claim 1, further comprising:
   mapping the frequency response requirements to a normalized design space, wherein the circuit element values are normalized values that are determined based on the mapped frequency response requirements; and
   unmapping the normalized circuit element values of the cascaded filter circuit design to a real design space.

4. The method of claim 3, wherein a normalized resonant frequency of the in-shunt resonator is lower than a normalized anti-resonant frequency of the in-line resonator by a factor of two to form a passband.

5. The method of claim 3, wherein a normalized anti-resonant frequency of the in-line resonator is lower than a normalized resonant frequency of the in-shunt resonator by about by a factor of one to form a stopband.

6. The method of claim 1, further comprising combining like circuit elements that are electrically adjacent to each other in the cascaded filter design prior to adding parasitic effects to the cascaded filter design.

7. The method of claim 1, further comprising performing an element removal optimization of the pre-optimized filter circuit design to create the final filter circuit design.

8. The method of claim 1, wherein the frequency response requirements comprise a rejection requirement, and the number of filter sections is selected based on the rejection requirement.

9. The method of claim 1, wherein the frequency response requirements comprises at least two of a passband and a stopband, and the filter section is selected based on the at least two of the passband and the stopband.

10. The method of claim 9, wherein the values of the paired in-line resonator and in-shunt resonator are selected to form one of the passband and the stopband.

11. The method of claim 10, wherein the frequency response requirements comprises the passband and the stopband.

12. The method of claim 11, wherein the values of the paired in-line resonator and in-shunt resonator are selected to form the passband, the plurality of circuit elements has another paired in-line resonator and in-shunt resonator, and the values of the other paired in-line resonator and in-shunt resonator are selected to form the stopband.

13. The method of claim 1, wherein the difference between the lowest resonant frequency and the highest resonant frequency of a plurality of resonators in the final filter circuit design is at least 1.25 times the frequency separation of any resonator in the plurality of resonators.

14. The method of claim 1, wherein the difference between the lowest resonant frequency and the highest resonant frequency of a plurality of resonators in the final filter circuit design is at least two times the frequency separation of the resonator with the highest resonant frequency in the plurality of resonators.

15. The method of claim 1, wherein the frequency response requirements comprises a passband, and wherein the frequency difference between a local minimum or a local maximum of a return loss magnitude of the final filter circuit design and the edge of the passband is at least once the frequency separation of the resonator with the highest resonant frequency in the final filter circuit design.

16. The method of claim 1, wherein the frequency response requirements comprises a passband, and wherein the frequency difference between a local minimum or a local maximum of a return loss magnitude of the final filter circuit design and the edge of the passband is at least 1.25 times the frequency separation of the resonator with the highest resonant frequency in the final filter circuit design.

17. The method of claim 1, wherein the frequency response requirements comprises a passband, and wherein the frequency difference between a local minimum or a local maximum of a return loss magnitude of the final filter circuit design and the edge of a passband is at least two times the frequency separation of the resonator with the highest resonant frequency in the final filter circuit design.

18. The method of claim 15, wherein the frequency requirements include an insertion loss requirement of less than 3 dB.

19. The method of claim 1, wherein the filter sections are identical to each other.

20. The method of claim 1, wherein all adjacent pairs of the immediately adjacent filter sections are connected to each other via their inputs or their outputs.

* * * * *